United States Patent [19]

Pliskin et al.

[11] Patent Number: 4,492,717
[45] Date of Patent: Jan. 8, 1985

[54] METHOD FOR FORMING A PLANARIZED INTEGRATED CIRCUIT

[75] Inventors: William A. Pliskin; Jacob Riseman, both of Poughkeepsie, N.Y.

[73] Assignee: International Business Machines Corporation, Armonk, N.Y.

[21] Appl. No.: 287,467

[22] Filed: Jul. 27, 1981

[51] Int. Cl.³ .......................................... H01L 21/316
[52] U.S. Cl. .................. 427/96; 204/192 D; 427/93; 427/240; 427/99
[58] Field of Search .............. 427/90, 93, 96, 99, 427/240; 204/192 D

[56] References Cited

U.S. PATENT DOCUMENTS

| | | | |
|---|---|---|---|
| 3,804,738 | 4/1974 | Lechaton et al. | 204/192 |
| 3,825,442 | 7/1974 | Moore | 117/212 |
| 3,887,733 | 6/1975 | Tolliver et al. | 427/444 |
| 3,899,372 | 8/1975 | Esch et al. | 148/187 |
| 3,925,572 | 12/1975 | Naber | 427/90 |
| 3,983,022 | 9/1976 | Auyang et al. | 204/192 |
| 4,045,594 | 8/1977 | Maddocks | 427/90 |
| 4,183,135 | 1/1980 | Welling | 29/588 |
| 4,204,894 | 5/1980 | Komeda et al. | 148/188 |
| 4,224,089 | 9/1980 | Nishimoto et al. | 148/187 |
| 4,251,571 | 2/1981 | Garbarino et al. | 427/89 |
| 4,271,582 | 6/1981 | Shirai et al. | 29/571 |
| 4,305,974 | 12/1981 | Abe | 427/90 |

*Primary Examiner*—John D. Smith

*Attorney, Agent, or Firm*—George O. Saile

[57] ABSTRACT

A method is given for forming a planarized integrated circuit structure just prior to the formation of metallurgy interconnection lines on the integrated circuit. The method begins with the integrated circuit intermediate product having devices formed therein but before interconnection metallurgy has been formed on the principal surface of the product. A glass layer is deposited in a non-conformal way onto the principal surface of the integrated circuit. The glass is chosen to have a thermal coefficient of expansion that approximates that silicon and has a softening temperature of less than about 1200° C. The thermal coefficient of expansion approximates that of silicon to reduce stress problems in the integrated circuit structure. The relatively low softening temperature is required for the next step of heating the structure to cause the flow of glass on the surface of the integrated circuit product to fill in the irregularities therein and to thereby planarize the integrated circuit surface. Openings are then formed through the glass down to the device elements of the integrated circuit. The interconnection metallurgy is formed over the surface of the glass and through the openings of the glass to interconnect the device elements of the integrated circuit. The glass may be deposited by various methods which include the sedimentation methods of spraying, centrifuging and spin-on plus sputtering or evaporation methods.

19 Claims, 7 Drawing Figures

METHOD FOR FORMING A PLANARIZED INTEGRATED CIRCUIT

BACKGROUND OF THE INVENTION

The invention relates to the fabrication of semiconductor devices and more particularly to methods for providing substantially planar integrated circuit structures before the deposition of interconnection metallurgy.

DESCRIPTION OF PRIOR ART

The growing and regrowing of insulating films such as silicon dioxide and the use of polysilicon in the form of conductors, ohmic contacts, resistors and the like in the manufacture of integrated circuits cause irregular or substantially non-planar surfaces across the surface of the semiconductor substrate. A major problem that is caused by these irregular or non-planar surface is loss of resolution in the standard lithographic masking processes. For example, metallized conductors formed on the insulating films have different widths across the surface of the semiconductor body due to the different resist development because of the resolution problems. To prevent conductors from having varying widths to the point where they might cause short circuits, extra spacing or tolerances are required with each conductor. The increased tolerances reduce the number of devices that may be formed in the semiconductor structure. This problem increases with each higher level of metallurgy. In highly dense integrated circuits 3 or 4 levels of interconnection metallurgy is required. A further problem is the different thicknesses of insulation across the semiconductor structure causes over-etching in places during the formation of openings in the insulator. The electrical characteristics of the devices in the integrated circuit can be altered by this particular problem.

These problems have been recognized in the prior art and attempts have been made to overcome the topographical problems. One form of partial planarization of electrically insulative films has used the technique of resputtering. This technique has been described in the J. S. Lechaton et. al. U.S. Pat. No. 3,804,738 and the R. P. Auyang et. al. U.S. Pat. No. 3,983,022. Another technique for planarization of insulating film thickness is described by R. P. Esch et. al. U.S. Pat. No. 3,899,372 wherein the differential growth rate of films on semiconductor surfaces has been optimized so that the differential rate of growth of insulative film is higher in the lower elevation areas than in the higher elevation areas which results in a substantially planar film at the end of the process.

These techniques, while partially solving the planarity problem, do not fully overcome planary particularly as the need for more than one or two levels of metallurgy is required on the surface of integrated circuits due to the increased complexities.

Another line of effort has concentrated on overcoming sharp edges on insulative films formed as passivating layers on integrated circuit structures. The desire to smooth out sharp corners in such structures is important to reduce the potential stresses which cause defects in the integrated circuit structure. Patents which represent this technology include the G. E. Moore U.S. Pat. No. 3,825,442; D. L. Tolliver et. al. U.S. Pat. No. 3,887,733; T. Komeda et. al. U.S. Pat. No. 4,204,894; K. Nishimoto et. al. U.S. Pat. No. 4,224,089; Garbarino et. al. U.S. Pat. No. 4,251,571 and K. Shirai et. al. U.S. Pat. No. 4,271,582. These patents in one way or another suggest deposition of a film on the integrated circuit structure, opening of a hole through such film and the heating of the structure so as to overcome the sharp corners at the opening through the film by a flow of the glasseous material. These techniques are solely involved in thin films usually of phosphosilicate glass, and which only attempt to smooth the sharp corners at the openings. There is no suggestion of solving the other more significant problem involving the planarity of an integrated circuit structure before the formation of the metallurgy interconnection system.

J. R. Welling U.S. Pat. No. 4,183,135 describes a method for encapsulation of bumps on a semiconductor die. The process involves coating the bumps and the active area with unfired glass and subsequently firing the glass at a temperature generally below 450° C. The firing causes a remelting of the glass and the formation of a continuous glass layer over the bumps. This invention is directed to solve a hermetic encapsulation problem involving a simple semiconductor device.

SUMMARY OF THE INVENTION

In accordance with the present invention a method is described for forming a planarized integrated circuit structure just prior to the formation of metallurgy interconnection lines on the integrated circuit. The method begins with the integrated circuit intermediate product having devices formed therein but before interconnection metallurgy has been formed on the principal surface of the product. A glass layer is deposited in a non-conformal way onto the principal surface of the integrated circuit. The glass is chosen to have a thermal coefficient of expansion that approximates that silicon and has a softening temperature of less than about 1200° C. The thermal coefficient of expansion approximates that of silicon to reduce stress problems in the integrated circuit structure. The relatively low softening temperature is required for the next step of heating the structure to cause the flow of glass on the surface of the integrated circuit product to fill in the irregularities therein and to thereby planarize the integrated circuit surface. Openings are then formed through the glass down to the device elements of the integrated circuit and the interconnection metallurgy is formed over the surface of the glass and through the openings of the glass to interconnect the device elements of the integrated circuit. The glass may be deposited by various methods which include the sedimentation methods of spraying, centrifuging and spin-on plus sputtering or evaporation methods.

DESCRIPTION OF THE PREFERRED EMBODIMENTS

Figure 1:
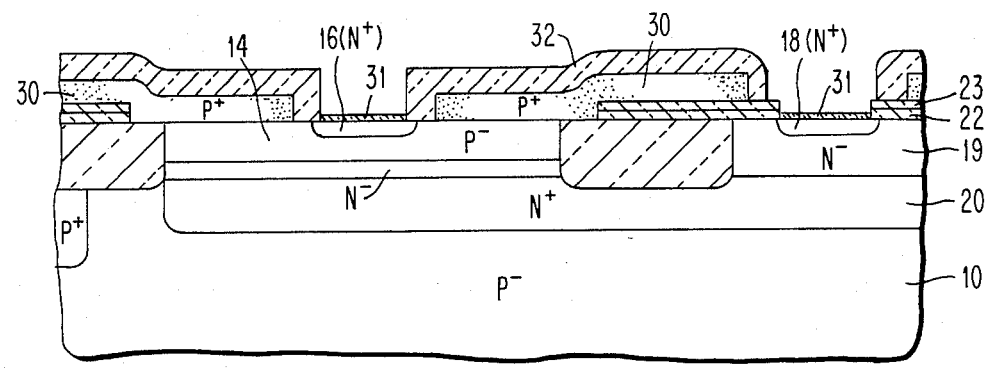
FIGS. 1 through 4 shows a first embodiment for planarizing a bipolar integrated circuit structure.

FIG. 1 illustrates an example of a bipolar integrated circuit structure which uses a polycrystalline silicon base contacts. This integrated circuit and its manufacture can be more fully understood with reference to the T. H. Ning et. al. U.S. Pat. No. 4,157,269 and the N. G. Anantha et. al. U.S. Pat. No. 4,160,991. The structure includes recessed oxide isolation regions, ROI, which isolate surface monocrystalline silicon regions from one another and which isolate the baseemitter region from the collector reach-through region. The bipolar integrated circuit structure is formed on a P− <100> crystallographic oriented silicon substrate 10. The base region 14 contains emitter region 16. An N+ collector reach-through region 18 cooperates with the N+ buried subcollector region 20 which is located in the P− substrate 10 and the epitaxial layer 19 thereover. Other portions of the epitaxial layer 19 are N− doped. Surface insulating layers 22, 23 are present to isolate the contacts to the elements of the devices in the semiconductor integrated circuit structure which are not desired to be contacted. The layer 22 may be composed of for example silicon dioxide and layer 23 composed of silicon nitride. However, in some structures only silicon gives examples of borosilicate, lead borosilicate and calcium alumino borosilicate glasses. The Table II lists glass-ceramics of the β-spodumene type. The Table III lists glass-ceramics of the cordierite type. The Tables II and III were taken from the A. H. Kumar et. al. U.S. Pat. No. 4,301,324 dated Nov. 17, 1981 and assigned to the same assignee as the present invention.

Subsequent to the formation of the emitter, an insulating $SiO_2$ surface substantially covers the entire device. To this layer, to prevent diffusion of undesired impurities such as Na, a silicon nitride film of about 500–1500 Å can be deposited. Whether or not the use of this film is necessary depends upon the glass to be used. This film acts as a barrier for preventing unwanted impurities from diffusion through it. In some processes such a film is always present. The glass is then deposited over this silicon nitride film.

TABLE I

| Glass or Material | Softening Point (°C.) | Coef. of Thermal Expansion (0–300° C.) per °C. | Weight % Compositions | | | | | | | |
|---|---|---|---|---|---|---|---|---|---|---|
| | | | $SiO_2$ | $B_2O_3$ | PbO | $Al_2O_3$ | CaO | $Na_2O$ | $K_2O$ | Other |
| LEAD BOROSILICATES: | | | | | | | | | | |
| Corning 7723 (X760LZ) | 770 | $35 \times 10^{-7}$ | 51.6 | 12.0 | 29.2 | 6.8 | — | >0.05 | — | 0.4 $As_2O_3$ |
| Corning 7720 | 755 | $36 \times 10^{-7}$ | 73 | 14 | 5.7 | 1.7 | — | 4.4 | — | — |
| Drakenfeld E1527 | 580 | $60 \times 10^{-7}$ | 29.1 | 9.0 | 51.1 | 3.2 | — | 1.7 | — | 2.8 Cd O; 2.0 $TiO_2$; 1.2 ZrO |
| BOROSILICATES: | | | | | | | | | | |
| Schott 8329 | 922 | $27.5 \times 10^{-7}$ | 83.2 | 10.9 | — | 2.5 | — | 2.2 | — | |
| Corning 7740 (Pyrex) | 820 | $33 \times 10^{-7}$ | 80.5 | 12.9 | — | 2.2 | — | 3.8 | 0.4 | |
| Corning 7760 | 780 | $34 \times 10^{-7}$ | 79 | 15 | — | 2 | — | 2 | 2 | |
| Corning 7050 | 705 | $46 \times 10^{-7}$ | 67 | 24 | — | 2 | — | 7 | — | |
| Corning 7052 | 710 | $46 \times 10^{-7}$ | 65 | 18 | — | 7 | — | 2 | 3 | 1 $Li_2O$ |
| Corning 7070 | 710 | $32 \times 10^{-7}$ | 71 | 26 | — | 1 | — | 0.5 | 1 | 0.5 $Li_2O$ |
| Corning 9741 | 705 | $39 \times 10^{-7}$ | 66 | 24 | — | 6 | — | 2 | — | 1 $Li_2O$ |
| Corning 3320 (Uranium Glass) | 780 | $40 \times 10^{-7}$ | 75 | 12.7 | 3.4 | 2.4 | — | 4.6 | — | 1.8 $U_3O_8$ |
| CALCIUM ALUMINO-BOROSILICATES: | | | | | | | | | | |
| Corning 1715 | 1060 | $35 \times 10^{-7}$ | 67 | — | — | 22 | 11 | — | — | |
| Corning 191CP | 1125 | $27 \times 10^{-7}$ | 77 | — | — | 16 | 7 | — | — | |
| Silicon | 1450 | $35 \times 10^{-7}$ | — | — | — | — | — | — | — | |
| Fused Silica ($SiO_2$) | 1600 | $5.5 \times 10^{-7}$ | 100 | — | — | — | — | — | — | | dioxide is utilized. Polycrystalline silicon contact 30 is made to the base region. A silicon dioxide layer 32 is formed over the polycrystalline silicon contact 30. A screen silicon dioxide layer 31 covers the emitter region 16 and collector reach-through region 18. It can be seen from FIG. 1 that the principal surface containing devices of this bipolar integrated circuit structure is substantially irregular and non-planar at the point where the first metallurgy interconnection is desired.

The FIG. 1 structure is now ready to be planarized with the dielectric glass material having a thermal coefficient of expansion that approximates that of silicon. The preferred range of the coefficient is between about 20 to $60 \times 10^{-7}$ per degree centigrade. The other important criterion for this glass metal is its softening temperature and its ability to flow upon heating to that softening temperature or above. The thickness of this glass is of the order of less than 1.5 micrometers and preferably less than one micrometers. Examples of glasses which will act according to these criterion are given in Tables I, II and III. The listed glasses merely are illustrative of glasses which can be used in this invention. The Table I

TABLE II

COMPOSITIONS OF β-SPODUMENE GLASS-CERAMICS

| | Weight % Compositions | | | |
|---|---|---|---|---|
| Glass No. | 1 | 2 | 3 | 4 |
| $SiO_2$ | 71.5 | 71.5 | 71.5 | 67.8 |
| $Al_2O_3$ | 15.0 | 13.0 | 13.0 | 16.0 |
| MgO | — | — | — | 1.5 |
| CaO | — | — | — | 4.5 |
| BaO | — | — | — | — |
| ZnO | — | 2.0 | 2.0 | — |
| $Li_2O$ | 10.0 | 10.0 | 8.0 | 4.2 |
| $Na_2O$ | — | — | — | 0.9 |
| $K_2O$ | 2.0 | 2.0 | 2.0 | — |
| $B_2O_3$ | — | — | 2.0 | 1.8 |
| $P_2O_5$ | 1.5 | 1.5 | 1.5 | — |
| $TiO_2$ | — | — | — | 2.5 |
| F | — | — | — | 0.8 |
| Softening Point (°C.) | 925 | 900 | 855 | 910 |
| Thermal Exp. Coef. (°C.$^{-1} \times 10^7$) | 32 | 43 | 29 | 20 |

TABLE III

| | CORDIERITE GLASS-CERAMICS | | | | | | | | | |
| --- | --- | --- | --- | --- | --- | --- | --- | --- | --- | --- |
| | (Weight % Compositions) | | | | | | | | | |
| Glass No. | 5 | 6 | 7 | 8 | 9 | 10 | 11 | 12 | 13 | 14 |
| MgO | 24 | 24.2 | 21.5 | 22 | 23 | 22 | 23.5 | 23.5 | 24.0 | 24.0 |
| $Al_2O_3$ | 21 | 21.2 | 21 | 22 | 22 | 22 | 21 | 21 | 21.0 | 21.84 |
| $SiO_2$ | 53 | 50.6 | 52.5 | 52.5 | 52 | 52 | 52.5 | 52.5 | 52.5 | 52.5 |
| $P_2O_5$ | 2 | 2.0 | 2 | 1.5 | 2 | 2 | — | — | 1.0 | 1.16 |
| $Li_2O$ | — | — | — | — | — | — | — | — | — | — |
| $B_2O_3$ | — | 2.0 | 1 | 0.5 | 1 | 1 | 1 | 1 | 0.5 | 0.5 |
| $ZrO_2$ | — | — | 2 | 1.5 | — | — | — | — | — | — |
| ZnO | — | — | — | — | — | 1 | — | — | — | — |
| $TiO_2$ | — | — | — | — | — | — | 2 | — | — | — |
| $SnO_2$ | — | — | — | — | — | — | — | 2 | — | — |
| Softening Point (°C.) | 1050 | 925 | 925 | 950 | 967 | 967 | 967 | 970 | 970 | 972 |
| Thermal Exp. Coef. (°C.$^{-1}$ × 10$^7$) | 37 | 30 | 33 | 24 | 23 | 24 | 30 | 33 | 33 | 34 |

Figure 2:
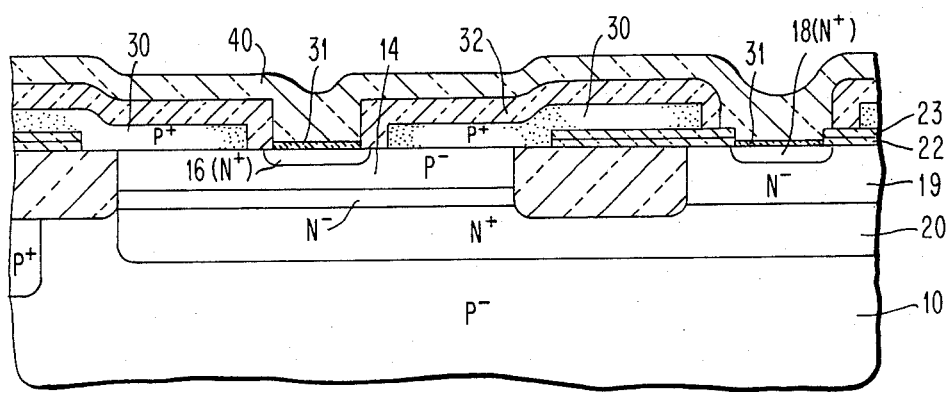

Referring now to FIG. 2 there is shown the result of the deposition of a glass layer 40 which fills the irregularities and covers the surface of the semiconductor integrated circuit. There are several ways to deposit the glass layer 40. The one aspect of these methods which is common to all is that the resulting glass preferentially deposits upon horizontal rather than vertical surfaces, that is a non-conformal deposition. One technique utilizes the sedimentation, centrifugation or spin-on of colloidal glass particles. Other methods would include the sputtering or evaporation of the glass onto the surface.

Sedimentation techniques by centrifugation are supplied generally in U.S. Pat. No. 3,212,921 and U.S. Pat. No. 3,212,929. Glass sedimentation is described in Pliskin and Conrad "Techniques for Obtaining Uniform Thin Glass Film on Substrates", Electrochemical Technology, Vol. 2, No. 7-8, pages 196–200 (1964). Spin-on techniques are described in J. A. Amick et. al., J. Vac. Soc. Tech. 14, No. 5, page 1053 (1977). In accordance with this known technology, a finally ground glass powder having properties providing a better match to silicon is employed as illustrated in the Table I. The glass power is ultrasonically mixed with a reasonably high dielectric medium. Typically, such a liquid is isopropyl alcohol. Then a lower dielectric constant fluid, such as ethyl acetate is added and is ultrasonically mixed with the other materials. By centrifugation techniques, coarse particles are then separated from this suspension. Centrifuging for several minutes at a medium rotate speed, for example at 500 G (gravitation) is utilized and the decanted liquid suspension obtained has fine particles of glass desirable for the glass deposition process. These steps may be repeated to obtain better separation and finer particles in the suspension which hereinafter will be referred to as the "concentrate". The glass suspension concentrate will then be coated onto the substrate in accordance with any of the above referenced techniques. The structure is then fired for a few minutes at a temperature above the softening point of the glass to form a clear glass film.

Sputtering methods could be used for depositing the glass by forming a target of the glass material and subsequently applying R.F. The sputtering process for insulators such as the glasses of the present invention is described in detail in the Handbook of Thin Film Technology, by L. I. Maissel et. al., published by McGraw Hill Book Co, New York, N.Y. 1970, pages 4-31 through 4-44.

The evaporation method for deposition of these glasses would use the E-beam evaporation technique. The films so formed would contour to the topography to a greater extent than by the previously mentioned methods. Fusing the glass film will correspondingly flow the glass. The methods for E-beam evaporation of these materials can be better understood with reference to pages 1-65 through 1-73 of the above-cited Handbook of Thin Film Technology and the W. Fedrowitz et. al. paper entitled "The Evaporation Capability of Various Glasses", published in Thin Solid Films, 72 (1980), pages 485 through 486.

Figure 3:
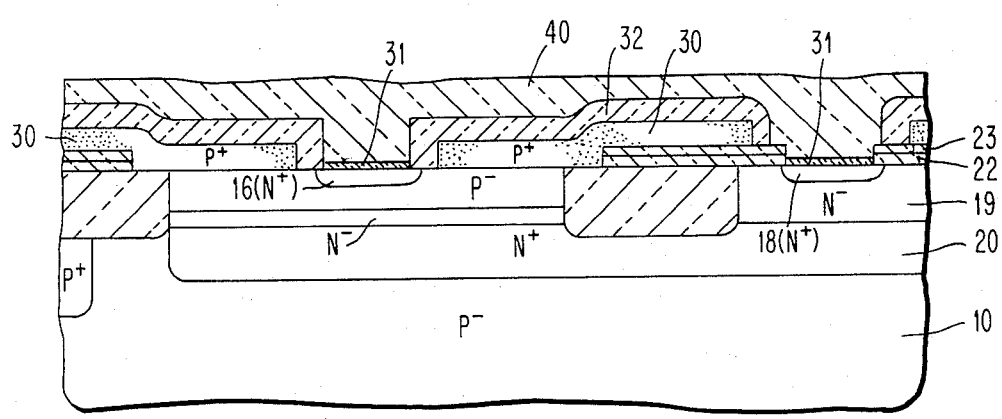

The FIG. 2 glass coated structure is further planarized by heating it at or above the softening point of the glass layer 40. At this temperature the softened glass will flow to approach a planarity. The result of this process is shown in FIG. 3.

Figure 4:
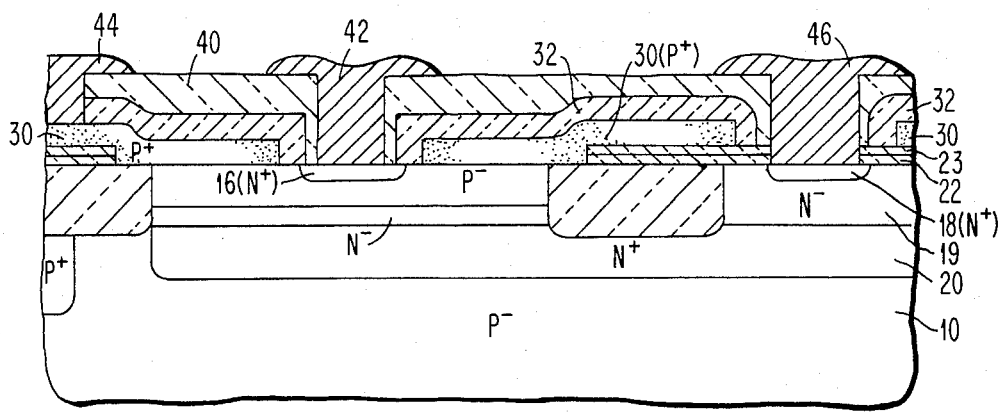

Referring now to FIG. 4 the openings are formed through the glass layer and silicon dioxide layers where appropriate down to the device elements of the integrated circuit structure. An interconnection metallurgy is then formed over and through the openings in the glass to interconnect the device elements of the integrated circuit. The openings in the glass and silicon dioxide layers are made by conventional lithography and etching techniques. The deposition of the interconnection metal layer and delineation of the metal lines are done by conventional metal evaporation, lithography and etching techniques. The resulting structure includes emitter contact 42 which ohmically contacts the emitter region 16, base metal contact 44 which contacts the polycrystalline silicon contact 30, and collector metal contact 46 which directly contacts the reach-through region 18.

The surface planarity is such that several additional levels of metallurgy with insulator therebetween can be made over this structure to allow further interconnection of the highly complex integrated circuit structure in the monocrystalline silicon body.

Figure 5:
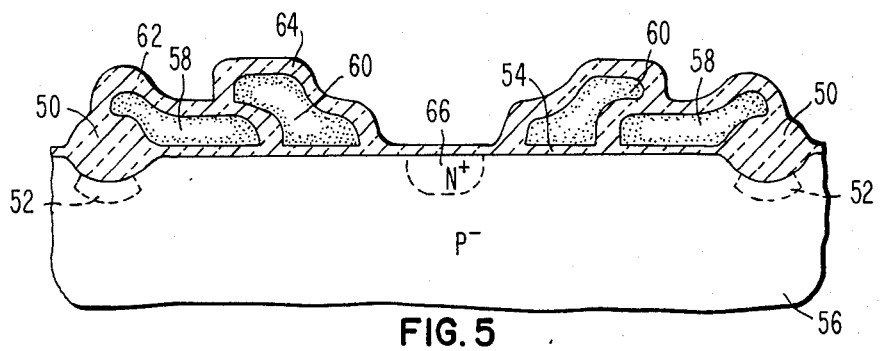
FIGS. 5 through 7 illustrate a second embodiment for planarizing a field effect transistor single random access memory cell integrated circuit.
Figure 6:
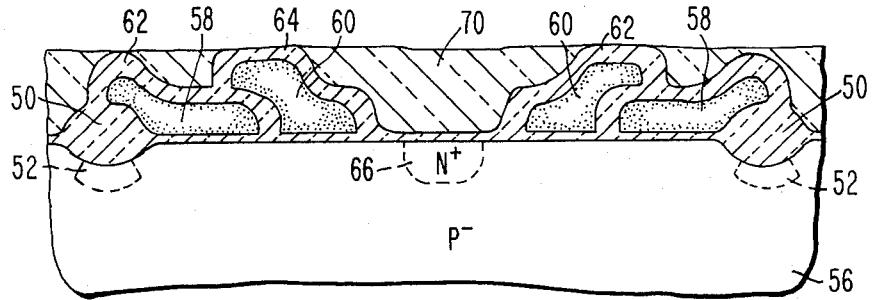
Figure 7:
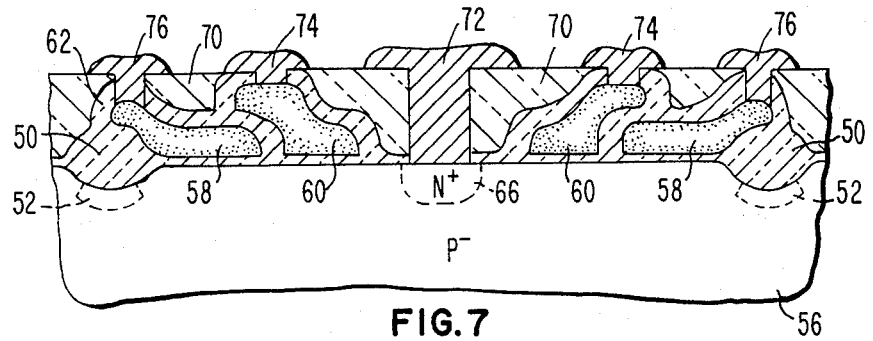

A second embodiment of the invention may be understood with reference to FIGS. 5, 6 and 7. FIG. 5 illustrates a double polycrystalline silicon dynamic random access memory cell structure. The cell structure is isolated from other such structures by recessed oxide isolation 50 having a channel stop region 52 thereunder. A silicon dioxide layer 54 is located on the P− substrate 56. The first polycrystalline silicon layer 58 acts as an electrode for the capacitor of the dynamic memory cell. The second polycrystalline silicon layer 60 is the gate electrode for the memory cell. Prior to the formation of the second polycrystalline silicon layer 60 a silicon dioxide layer 62 is thermally grown over the first polycrystalline layer 58. Similarly, a silicon dioxide layer 64 is grown over the second polycrystalline layer 60. The N+ source region 66 is located adjacent to the gate of the memory cell. As can be readily seen the structure is non-planar and the surface is irregular at the point at which the interconnection metallurgy is to be formed.

The structure is planarized by the deposition of a glass material 70 according to the same procedures as described in regard to the first embodiment. The heating and planarization steps result in the planarized structure shown in FIG. 6. Openings are made by standard etching techniques through the glass down to the device elements of the random access memory integrated circuit. The interconnection metallurgy is formed over and through the openings in the glass material to interconnect the device elements of the integrated circuit as was described in regard to the earlier embodiment. FIG. 7 shows the result of this process wherein the source contact is 72, the gate contact is 74 and the capacitor contact is 76. Other levels of metallurgy can now be applied over the surface with the proper dielectric insulation used between the first metal structure and any succeeding metal interconnection structures.

While the invention has been particularly shown and described with reference to the preferred embodiments thereof, it will be understood by those skilled in the art that various changes in form and details may be made without departing from the spirit and scope of the invention.

What is claimed is:

1. A method for forming a planarized integrated circuit structure comprising:
   providing an integrated circuit intermediate product having devices formed therein but before metallurgy has been formed on a principal surface of said product and having a non-planar surface composed of many step-like irregularities;
   non-conformally depositing preferentially upon the horizontal surfaces of said irregularities a glass layer having a thermal coefficient of expansion that approximates that of silicon and has a softening temperature of less than about 1200° C. onto said surface;
   heating the structure to cause the flow of said glass on said surface to fill in the said irregularities therein and to planarize said surface;
   forming openings through said glass down to the device elements of said integrated circuit; and
   forming an interconnection metallurgy over and through said openings in said glass to interconnect said device elements of said integrated circuit.

2. The method of claim 1 wherein a silicon dioxide layer is substantially under all of said glass layer.

3. The method of claim 2 wherein a silicon nitride layer is intermediate to said silicon dioxide and said glass layer.

4. The method of claim 1 wherein said glass is formed by a sedimentation process.

5. The method of claim 4 wherein said sedimentation process involves spray coating of glass particles upon said surfaces of said substrate.

6. The method of claim 4 wherein said sedimentation process involves centrifuging a coating of glass particles upon said surfaces of said substrate.

7. The method of claim 4 wherein said sedimentation process involves a spin-on of a coating of glass particles upon said surfaces of said substrate.

8. The method of claim 1 wherein said glass is formed by a sputtering process.

9. The method of claim 1 wherein said glass is formed by an evaporation process.

10. The method of claim 1 wherein the said heating step raises the temperature of said structure to less than about 1000° C. to cause said flow.

11. The method of claim 1 wherein the said glass has a thermal coefficient of expansion between about 20 to $60 \times 10^{-7}$ per degree centigrade.

12. The method of claim 11 wherein said glass is a lead borosilicate glass.

13. The method of claim 11 wherein said glass is a calcium alumino borosilicate glass.

14. The method of claim 11 wherein said glass is a $\beta$-spodumene glass-ceramic.

15. The method of claim 11 wherein said glass is a cordierite glass-ceramic.

16. The method of claim 3 wherein there is a significant sodium content in said glass.

17. The method of claim 1 wherein the said glass is substantially sodium free.

18. The method of claim 1 wherein said integrated circuit includes a substantial number of bipolar transistor devices therein.

19. The method of claim 1 wherein said integrated circuit includes a substantial number of field effect transistor devices therein.

* * * * *